United States Patent
Beerens et al.

(10) Patent No.: US 9,383,659 B2
(45) Date of Patent: Jul. 5, 2016

(54) POSITIONING SYSTEM, LITHOGRAPHIC APPARATUS AND DEVICE MANUFACTURING METHOD

(71) Applicant: ASML Netherlands B.V., Veldhoven (NL)

(72) Inventors: Ruud Antonius Catharina Maria Beerens, Roggel (NL); Andre Bernardus Jeunink, Bergeijk (NL); Marinus Maria Johannes Van De Wal, Oirschot (NL); Wilhelmus Henricus Theodorus Maria Aangenent, 's-Hertogenbosch (NL); Richard Henricus Adrianus Van Lieshout, Batenburg (NL); Henricus Martinus Johannes Van De Groes, Tiel (NL); Saartje Willemijn Van Der Hoeven, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 7 days.

(21) Appl. No.: 14/407,038

(22) PCT Filed: Jun. 13, 2013

(86) PCT No.: PCT/EP2013/062263
§ 371 (c)(1),
(2) Date: Dec. 10, 2014

(87) PCT Pub. No.: WO2013/186307
PCT Pub. Date: Dec. 19, 2013

(65) Prior Publication Data
US 2015/0168852 A1 Jun. 18, 2015

Related U.S. Application Data

(60) Provisional application No. 61/660,471, filed on Jun. 15, 2012.

(51) Int. Cl.
*G03B 27/58* (2006.01)
*G03B 27/42* (2006.01)
*G03F 7/20* (2006.01)

(52) U.S. Cl.
CPC ........ *G03F 7/70775* (2013.01); *G03F 7/70783* (2013.01)

(58) Field of Classification Search
CPC .................. G03F 7/70775; G03F 7/70725
USPC .................................. 355/53, 72–76
See application file for complete search history.

(56) References Cited

U.S. PATENT DOCUMENTS

| 5,363,196 A | 11/1994 | Cameron |
| 7,649,611 B2 | 1/2010 | Zaal et al. |

(Continued)

FOREIGN PATENT DOCUMENTS

| CN | 101893827 | 11/2010 |
| EP | 1 804 122 | 7/2007 |

(Continued)

OTHER PUBLICATIONS

Chinese Office Action dated Oct. 8, 2015 in corresponding Chinese Patent Application No. 201380031081.5.

(Continued)

*Primary Examiner* — Hung Henry Nguyen
(74) *Attorney, Agent, or Firm* — Pillsbury Winthrop Shaw Pittman LLP

(57) ABSTRACT

There is provided a positioning system for positioning an object in a lithographic apparatus. The positioning system includes a support, a position measurement device, a deformation sensor and a processor. The support is constructed to hold the object. The position measurement device is configured to measure a position of the support. The position measurement device includes at least one position sensor target and a plurality of position sensors to cooperate with the at least one position sensor target to provide a redundant set of position signals representing the position of the support. The deformation sensor is arranged to provide a deformation signal representing a deformation of one of the support and the position measurement device. The processor is configured to calibrate one of the position measurement device and the deformation sensor based on the deformation signal and the redundant set of position signals.

14 Claims, 7 Drawing Sheets

(56) References Cited

U.S. PATENT DOCUMENTS

| | | |
|---|---|---|
| 8,451,454 B2 | 5/2013 | Koenen et al. |
| 8,570,492 B2 | 10/2013 | Van Der Pasch et al. |
| 8,922,756 B2 | 12/2014 | Koenen et al. |
| 9,019,470 B2 | 4/2015 | Van Eijk et al. |
| 2003/0090675 A1 | 5/2003 | Fujiwara |
| 2007/0109522 A1 | 5/2007 | Ebihara et al. |
| 2007/0153244 A1 | 7/2007 | Maria Zaal et al. |
| 2007/0280609 A1 | 12/2007 | Ito |
| 2009/0001260 A1 | 1/2009 | Klaver et al. |
| 2009/0128791 A1 | 5/2009 | Koenen et al. |
| 2009/0268185 A1 | 10/2009 | Vervoordeldonk et al. |
| 2010/0157263 A1 | 6/2010 | Van Eijk et al. |
| 2010/0235127 A1 | 9/2010 | Kwan |
| 2011/0026004 A1* | 2/2011 | Van Eijk ............ G03B 27/58 355/72 |
| 2012/0050709 A1* | 3/2012 | Van Der Pasch ...... G03F 7/7085 355/67 |
| 2012/0078561 A1 | 3/2012 | Knijn et al. |
| 2012/0147352 A1 | 6/2012 | Ito |
| 2012/0242969 A1 | 9/2012 | Van Der Pasch et al. |
| 2012/0249987 A1 | 10/2012 | Vermeulen et al. |
| 2013/0050670 A1 | 2/2013 | Koenen et al. |

FOREIGN PATENT DOCUMENTS

| | | |
|---|---|---|
| JP | H03-061861 | 3/1991 |
| JP | H11-008189 | 1/1999 |
| JP | 2007-194618 | 8/2007 |
| JP | 2009-135490 | 6/2009 |
| JP | 2010-166037 | 7/2010 |
| JP | 2010-541231 | 12/2010 |
| JP | 2012-124540 | 6/2012 |
| JP | 2012-191205 | 10/2012 |
| JP | 2013-079939 | 5/2013 |
| WO | 2007/049603 | 5/2007 |
| WO | 2011/040642 | 4/2011 |

OTHER PUBLICATIONS

Japanese Office Action dated Nov. 17, 2015 in corresponding Japanese Patent Application No. 2015-516615.

International Search Report mailed Aug. 23, 2013 in corresponding International Patent Application No. PCT/EP2013/062263.

Korean Office Action dated Apr. 15, 2016 in corresponding Korean Patent Application No. 10-2015-7000726.

* cited by examiner (a)

(b)

(a)

(b)

POSITIONING SYSTEM, LITHOGRAPHIC APPARATUS AND DEVICE MANUFACTURING METHOD

CROSS-REFERENCE TO RELATED APPLICATIONS

This application is the U.S. national phase entry of International Patent Application No. PCT/EP2013/062263, filed Jun. 13, 2013, which claims the benefit of priority from U.S. provisional application 61/660,471, which was filed on Jun. 15, 2012, and which is incorporated herein in its entirety by reference.

FIELD

The present invention relates to a positioning system, a lithographic apparatus and a method for manufacturing a device.

BACKGROUND

A lithographic apparatus is a machine that applies a desired pattern onto a substrate, usually onto a target portion of the substrate, to create a device. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is exposed by scanning the pattern through a radiation beam in a given direction (the "scanning"-direction) while synchronously scanning the substrate parallel to this direction. It is also possible to transfer the pattern from the patterning device to the substrate by imprinting the pattern onto the substrate.

In most cases, the process of exposing the target portions is repeated a plurality of times, thereby generating a device comprising a plurality of layers. In order for proper operation of the device, an accurate positioning of the layers relative to each other is needed. As such, during the exposure process, the position of the substrate relative to the patterning device needs to be accurate. In order to determine this position, a lithographic apparatus in general comprises a position measurement system such as an interferometer based measurement system or an encoder based measurement system. Such systems can e.g. be used for determining a position of a support holding the patterning device relative to a position of a support holding the substrate. Such systems generally have a position sensor target and a position sensor. The position measurement system determines the position of a support by determining a displacement between the position sensor target and the position sensor. Based on the displacement, the position measurement system creates a position signal.

As will be understood by the skilled person, an accurate positioning of the support using the position measurement system, relies on the position signal provided by the position measurement system. However, the displacement between the position sensor target and the position sensor may not be an accurate measure of the position of the substrate relative to the patterning device. The accuracy may deteriorate due to deformations of the supports or the position measurement device. An undesired displacement of the position sensor and position sensor target, for example due to thermal drift, could also deteriorate the accuracy.

In order to accommodate for such a deformation or displacement, a periodic calibration of the position measurement system is often applied. In general, such a calibration may be time-consuming and may result in an important down-time of the apparatus, thus adversely affecting the productivity of the apparatus.

SUMMARY

It is desirable to provide a more accurate positioning system which can be calibrated in a less time-consuming manner.

Therefore, according to an embodiment of the present invention, there is provided a positioning system for positioning an object in a lithographic apparatus. The positioning system comprises a support, a position measurement device, a deformation sensor and a processor. The support is constructed to hold the object. The position measurement device is configured to measure a position of the support. The position measurement device comprises at least one position sensor target and a plurality of position sensors to cooperate with the at least one position sensor target to provide a redundant set of position signals representing the position of the support. The deformation sensor is arranged to provide a deformation signal representing a deformation of one of the support and the position measurement device. The processor is configured to calibrate one of the position measurement device and the deformation sensor based on the deformation signal and the redundant set of position signals.

According to an embodiment of the invention, there is further provided a lithographic apparatus comprising the positioning system mentioned above. The lithographic apparatus comprises a patterning device support, a substrate table and a projection system. The patterning device support is constructed to support a patterning device having a pattern. The substrate table is constructed to hold a substrate. The projection system is constructed to project the pattern onto the substrate. The support comprises the patterning device support. The object comprises the patterning device.

According to an embodiment of the invention, there is further provided a lithographic apparatus comprising the positioning system mentioned above. The lithographic apparatus comprises a patterning device support, a substrate table and a projection system. The patterning device support is constructed to support a patterning device having a pattern. The substrate table is constructed to hold a substrate. The projection system is constructed to project the pattern onto the substrate. The support comprises the substrate table. The object comprises the substrate.

In another embodiment of the present invention, there is provided a device manufacturing method comprising positioning an object using the positioning system or the lithographic apparatus mentioned above.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
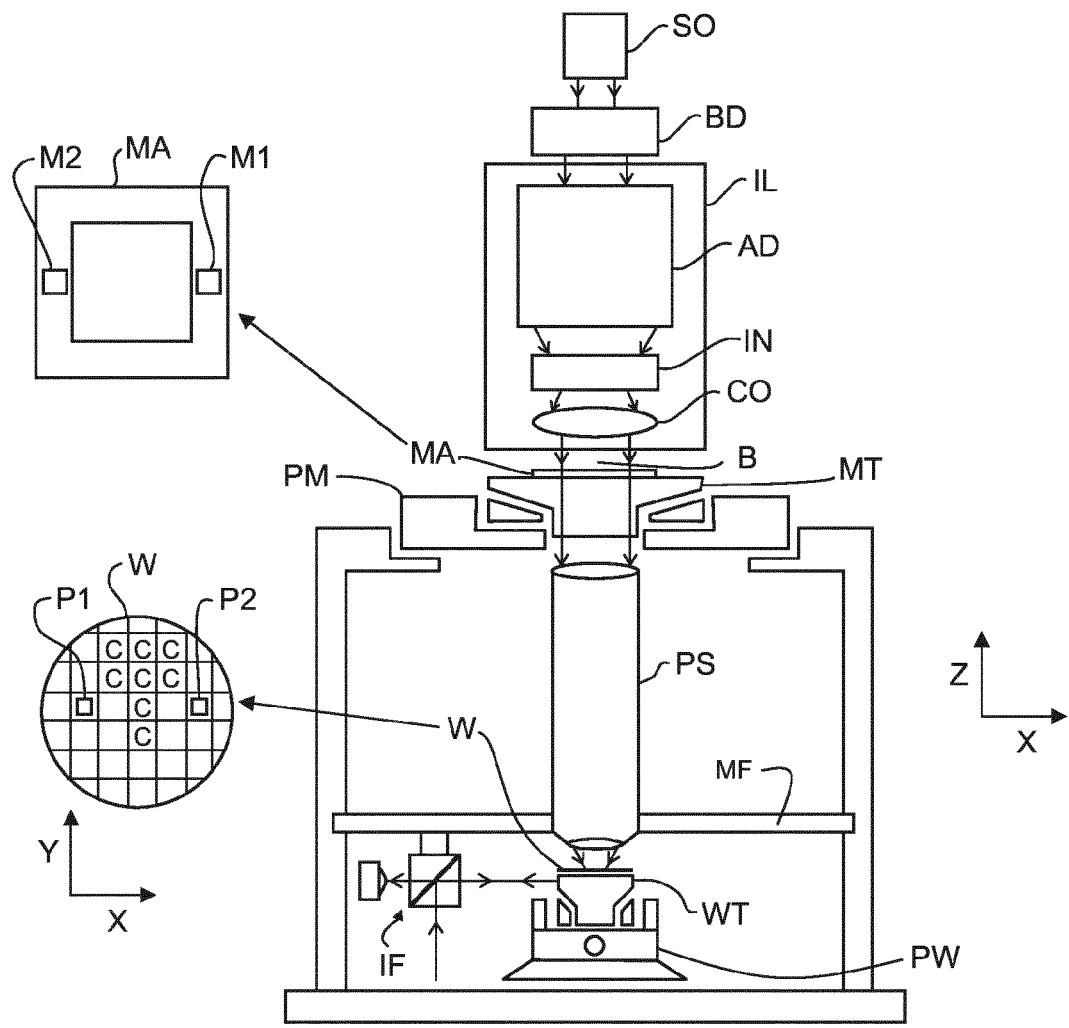
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a support structure or patterning device support (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or substrate support constructed to hold a substrate (e.g. a resist-coated wafer) W. The substrate table WT is connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix. Any use of the terms "reticle" or "mask" herein may be considered synonymous with the more general term "patterning device."

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum.

The lithographic apparatus may be of a type having two or more substrate tables, and/or of a type having two or more patterning device supports. In such "multiple stage" machines, the additional tables and supports may be used in parallel, or preparatory steps may be carried out on one table or support while another tables or support is being used for exposure. A lithographic apparatus may have a substrate table and an additional table arranged to hold measurement equipment instead of a substrate.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device and the projection system Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on and patterned by the patterning device MA, which is held on the support structure MT. Having traversed the patterning device MA, the radiation beam B passes through the projection system PS, which focuses the beam onto a target portion C of the substrate W. With the aid of the second positioning device PW and position measurement device IF, the substrate table WT can be moved accurately, e.g. so as to position different target portions C in the path of the radiation beam B. The position measurement device IF may be an interferometric device, linear or planar encoder or capacitive sensor. Similarly, the first positioning device PM and another position measurement sensor or device (which is not explicitly depicted in FIG. 1) can be used to accurately position the patterning device MA with respect to the path of the radiation beam B, e.g. during a scan. In general, movement of the support structure MT may be realized with the aid of a long-stroke module and a short-stroke module, which form part of the first positioning device PM. The long-stroke module provides coarse movement of the short-stroke module over a long range. The short-stroke module provides fine movement of the support structure MT over a short range. Similarly, movement of the substrate table WT may be realized using a long-stroke module and a short-stroke module, which form part of the second positioning device PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions. Similarly, in situations in which more than one die is provided on the patterning device MA, the patterning device alignment marks may be located between the dies.

In accordance with an embodiment of the present invention, the position measurement device IF comprising a plurality of position sensors configured to provide a redundant set of position signals. A redundant set of position signals means that there are more position signals than degrees of freedom in which the measured object can move. For example, when the substrate table is moveable in 6 degrees of freedom, and the position measurement device provides a set of 8 position signals, the set is redundant with 2 redundant position signals. The redundant set may be provided for positions in at least part of an operating area of the substrate table WT. The position sensors may comprise a plurality of interferometers co-operating with reflective surfaces of the substrate table WT or mounted to the substrate table WT. Alternatively or in addition, the position measurement device can comprise a plurality of encoder heads or sensors co-operating with one or more gratings. The grating may have a linear or a two-dimensional grating pattern, such as a checkerboard pattern. The grating may be mounted on the metrology frame MF as shown in FIG. 1, while a plurality of encoder heads is mounted to the substrate table WT. The metrology frame MF may be a vibrationally isolated frame such as a frame supporting the projection system PS. In accordance with an embodiment of the present invention, sufficient position sensors are provided to create, at least in a part of the operating range of the substrate table WT, a redundant set of position signals. As an example, a position sensor could be mounted at each of the four corners of the substrate table. The sensors co-operate with one or more gratings, wherein each sensor is arranged to provide a two-dimensional position signal, for example a vertical Z-position and a horizontal direction in the XY plane. In accordance with an embodiment of the present invention, the apparatus as shown in FIG. 1 further comprises one or more deformation sensors (not shown) arranged to provide a deformation signal representing a deformation of the substrate table or the position measurement device. As an example, one or more strain sensors can be mounted at designated locations of the substrate table, whereby an output signal of these sensors can represent a deformation of the substrate table.

In accordance with an embodiment of the present invention, various types of deformation sensors can be used, based on various sensing principles. The term "deformation sensor" is used to denote a sensor providing information about a deformation of the substrate table or position measurement device. In this respect it should be noted that such information may also be obtained from a position sensor that is arranged to determine a deformation of the substrate table or (part of) the position measurement device. As an example, an array of position sensors may be arranged on a reference frame and arranged to determine a distance between a particular location and the reference frame. Based on the distances determined, the shape of the substrate table or position measurement device can be determined. As such, in accordance with an embodiment of the present invention, a deformation signal can be formed or derived from one or more position signals.

As such, the following examples of deformation and/or position sensors could be applied in an embodiment of the present invention for generating the deformation signals: optical sensors, capacitive or inductive sensors, etalon sensors, fiber optic sensors such as Fiber Bragg sensors, birefringence based sensors.

Optical sensors, capacitive sensors and/or inductive sensors may be stationary, for example fixed to the metrology frame MF, and may be used to determine deformation of the substrate table WT. When the sensors are not on the moveable substrate table WT, less electrical wires are connected to the substrate table, which reduces disturbance of the movement of the substrate table WT. Fiber optics and/or strain sensors may be connected to the substrate table WT. The sensors may be placed on the substrate table at specific locations to measure dominant deformations or eigenmodes with a minimum amount of sensors.

In accordance with an embodiment of the present invention, the redundant set of position signals and the deformation signal are provided to a processing unit for processing.

By providing a positioning system that includes a positioning device and position measurement system, the calibration of the positioning system can be facilitated in the following manner:

By providing a deformation signal representing a deformation of the substrate table to a processing unit (also broadly termed "processor"), additional information is made available which can be applied for either calibrating the position measurement system or for assessing whether a calibration of the position measurement system is required. In an embodiment, the processor is configured to calibrate the plurality of position sensors based on the deformation signal and calibrate the deformation sensor based on the redundant set of position signals.

Alternatively or in addition, the availability of a redundant set of position signals enables a calibration of the deformation sensor.

Further, from a redundant set of position signals a subset may be used to control the position of the substrate table WT, while the remaining other position signals are used for calibrating the position sensors or for assessing whether a calibration is required.

Further details on those ways to improve calibration are provided below.

As a result of such improved calibration, a more accurate positioning of the substrate table (and thus of the substrate) during an exposure cycle of the substrate can be obtained as follows: in the positioning system according to an embodiment of the invention, position information is made available using the position signals of the position measurement system of the substrate table. Information indicative of the deformation of the substrate table is made available using the deformation signal. The latter information may be applied to determine or estimate a shape of the substrate table and, more particular, determine, in combination with the position information, an accurate position of a particular position on the substrate.

The depicted apparatus could be used in at least one of the three following modes:

The first mode is a so-called step mode. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

The second mode is a so-called scan mode. In scan mode, the support structure MT and the substrate table WT are scanned synchronously while a pattern imparted to the radiation beam is projected onto a target portion C (i.e. a single dynamic exposure). The velocity and direction of the substrate table WT or relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In a third mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
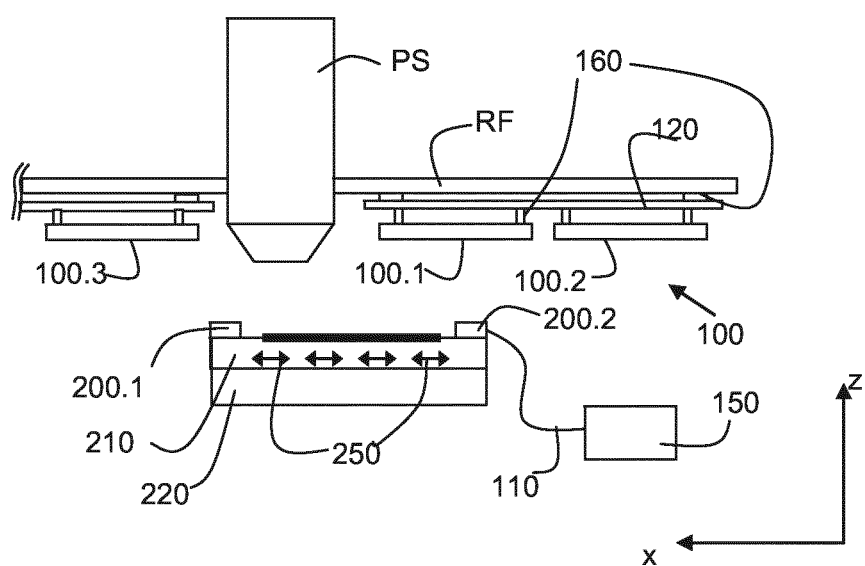
FIG. 2 depicts a positioning system according to an embodiment of the invention.

In FIG. 2, a positioning system according to an embodiment of the invention is schematically shown. The positioning system is for positioning an object such as a substrate or a patterning device. The positioning system comprises a position measurement device comprising position sensors 200.1, 200.2 co-operating with gratings 100.1, 100.2, 100.3, which are an example of a position sensor target. The gratings 100.1-100.3 may have a one- or two-dimensional grating pattern, to provide a position signal 110 to a processing unit 150 of the positioning system. In the arrangement as shown, the gratings 100.1-100.3 are mounted to a common frame 120 of the measurement system. The common frame 120 may be made from Zerodur or any other type of low thermal expansion material. The common frame 120 is mounted to a reference frame RF such as a metrology frame MF to which a projection system PS is also mounted, as shown in FIG. 1. In the embodiment shown, the position sensors 200.1 and 200.2 are mounted to an object table 210 which may be the substrate table WT or the pattern device support MT mentioned above. The object table 210 is mounted to a positioning device 220 for displacing the object table 210 relative to the projection system PS, e.g. by means of linear motors or actuators. In an embodiment, the object table 210 is a measurement stage arranged to hold measurement equipment instead of a substrate.

During operating, the sensors can provide a signal 110 to the processing unit or processor 150, said signal e.g. representing the position of the sensor 200.1 relative to the grating 100.1. Note that in general, the position signal may represent a position in a horizontal direction (in the XY-plane) or the vertical direction (Z-direction), or a combination thereof. In an embodiment, the object table 210 is provided with four sensors, each sensor being arranged to provide a two-dimensional position signal to the processing unit. In accordance with an embodiment of the present invention, the position measurement device can provide a redundant set of position signals in at least part of an operating range of the substrate table.

In order to position the object table, the processing unit 150 can convert a position signal as provided by the position sensors to a signal representing the actual position of the object table 210. Such a signal may further be used as a position reference to a position control system controlling the actuators or motors of the positioning device 220, for example in a feedback loop. Such a conversion may comprise a linear translation. Note that such a conversion may be different for each co-operating pair of a sensor and a grating. In the embodiment as shown, the object table 210 is further provided with sensors 250 that are configured to sense or determine a deformation of the object table 210. As an example, the sensors as schematically indicated can be strain sensors that are mounted to the object table, e.g. glued to the object table. Such strain sensors may take the form of a Fiber Bragg grating or an array of Fiber Bragg gratings. A Fiber Bragg Grating (FBG) is an optical fiber with a typical diameter 125 µm and a periodic modulation (Bragg grating) of the refractive index of the fiber core. In a long fiber, this modulation is generated locally, so that the sensor and the connecting fiber can form a monolithic unit. The Bragg grating can be as short as 2 mm. It may reflect a narrow wavelength band of light while it transmits all other wavelengths or vice versa. The reflection peaks of multiple cascaded FBGs in a single fiber can be individually identified due to the wavelength selection property of the FBG, which allows the determination of deformation of a large part of the object table 210 with only a single fiber. The sensor principle is based upon length variations of the FBGs, such length variations e.g. due to local deformation of the object table. In this respect, reference can be made to NL Appl. No. 2006180, incorporated herein by reference in its entirety. In an embodiment, such an array of gratings is mounted in a meandering manner onto the object table. In accordance with an embodiment of the present invention, calibration of either the position sensors or the deformation sensors is performed based on the sensor signals.

Such a calibration is in general desired and should be repeated at regular intervals due to deformations of either the object table (equipped with the position sensors in the embodiment as shown) or the gratings, e.g. due to gravity or creep of mounting elements 160 that are used to mount the gratings to the common frame 120 or the common frame 120 to the reference frame RF. The deformation would e.g. cause the gratings to displace in vertical (Z) direction, resulting in an erroneous position of the substrate relative to the projection system PS.

In a similar manner, particular types of deformation sensors such as strain sensors are susceptible to deformation, resulting in a drift of the output signal. Therefore, such sensors need to be calibrated as well on a regular basis. Typically, the deformation or drifting of the position measurement device may take place at a comparatively large time scale whereas the deformation sensors only remain stable at a comparatively small time scale. For example, the position measurement device may remain stable for several days or even weeks, whereas a drift of the output signal of a strain sensor such as a FBG may need to be calibrated every 5 min or less.

In accordance with an embodiment of the present invention, use is made of this difference in time scale.

In the embodiment as shown, the redundant set of position signals may be used to determine or estimate a deformation of the object table. This can be explained as follows:

Assuming the position measurement device (e.g. an encoder based measurement system as schematically depicted in FIG. 2) which is in a calibrated state. When, in such a calibrated state, a redundant set of position signals is available, this redundant set of signals may reveal certain inconsistencies. These inconsistencies may be deviations from expected position signals in case of a rigid, non-deformed object table. Assuming e.g. that 4 position signals are available that provide information on the vertical position of 4 position sensors that are mounted in a coplanar manner to the object table. Since 3 position sensors are sufficient to determine all vertical degrees of freedom of a rigid body, one position sensor is redundant. If the position of the position sensors as derived from the position signals indicate that the position sensors are not in the same plane, it can be assumed that the object table is deformed. Using such deformation information, the deformation sensor, such as the sensors 250 as shown in FIG. 2, can be calibrated. This calibration may be done when the lithographic apparatus is not exposing a substrate, but this may reduce the throughput of the lithographic apparatus. In addition or alternatively, the calibration may be done when the lithographic apparatus is exposing a substrate, which may not lead to a loss in throughput. The calibration may be done when the substrate table is at a constant speed to minimize deformations of the substrate during calibration.

In this respect, it is worth mentioning that the types or modes of deformation which can be identified by the position measurement device using the redundant set of position signals, may vary. This variation depends on the number and type of position sensors used. Certain position sensor configurations may enable the detection of a torsion mode deformation of the substrate table e.g. a torsion about the X-axis in FIG. 2. Such configurations may not capable of detecting an umbrella type deformation. In an umbrella type deformation the four corners of the substrate table remain substantially coplanar but the center of the substrate table is either in a higher or lower plane. A different configuration may be used to determine the umbrella type deformation. A deformation may be observed by a subset of the deformation sensors. Note that, in order to detect particular deformation modes, a particular position and orientation of the deformation sensors may be required. In an embodiment, the position measurement device of the positioning system is equipped with a dedicated set of deformation sensors for detecting particular deformation modes, such as the umbrella mode.

In an embodiment, the positioning device is applied to deform the substrate table for calibration purposes. As an illustration, the positioning device may comprise four actuators, each arranged near one of the four corners of the substrate table for positioning the substrate table in vertical position. By exerting the appropriate forces, the substrate table can be brought in a torsional deformation mode. Such mode may be identified by a redundant set of position signals, for example derived from the four position sensors arranged near the corners of the substrate table. A resulting deformation of the substrate table can be determined or estimated. Given the deformation, a calibration of the deformation sensors may subsequently be performed.

As mentioned above, the position measurement device is arranged to provide a redundant set of position signals in at least part of an operating range of the substrate table. An example of such an arrangement is schematically shown in FIG. 3.

Figure 3:
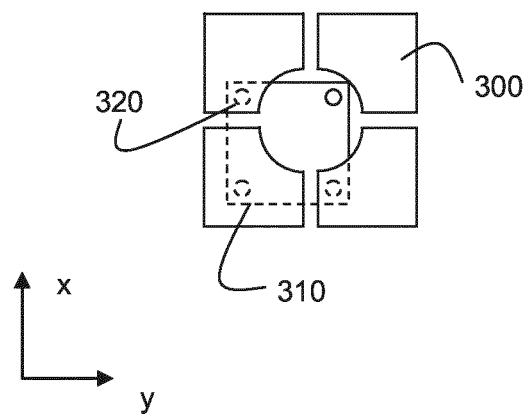
FIG. 3, comprising FIGS. 3(*a*) and 3(*b*), depicts an encoder based positioning device suitable for generating a redundant set of position signals.
Figure 3:
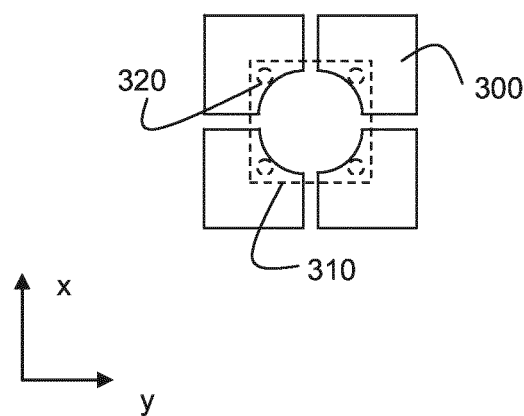

In FIG. 3, a top view is shown of a position measurement device comprising 4 plate-shaped gratings 300 arranged above an object table 310, such as the substrate table WT or patterning device support MT. The object table 310 is provided with 4 position sensors 320 arranged near the corners of the substrate table. Each sensor provides a vertical (z-position) and a horizontal (x-position, y-position or a combination thereof) position signal. As such, when the stage is in such a position that only 3 sensors are operational (i.e. are in a position below a grating), as depicted in FIG. 3 (*a*), 6 position signals are obtained which are sufficient to determine the stage position in 6 degrees of freedom. When the stage is in a position as depicted in FIG. 3 (*b*), 8 position signals, representing 8 degrees of freedom, are available which can be inconsistent. Such inconsistency can be due to a deformation or drift of the substrate table or the gratings or of a common frame connecting the gratings to a reference frame. In case the inconsistency is due to a drift of the measurement device (e.g. a displacement or deformation of a grating 300 as shown) there may be a need for a re-calibration of the measurement device. In accordance with an embodiment of the present invention, the deformation signal as obtained from the deformation sensor (e.g. sensors 250 as shown in FIG. 2) may facilitate in distinguishing between a situation wherein the inconsistency is due to a deformation of the substrate table and a situation wherein the inconsistency is due to a drift of the position measurement device. For example, in a situation the deformation signal indicates that there is no deformation of the substrate table. Simultaneously, the position sensors may provide a redundant set of position signals, which are inconsistent to each other. This situation may indicate that the reference part of the position sensors is changing, for example drifting. The reference part may be the grating 300 if the position sensor is part of an encoder system. The reference part may be a reflective surface, such as a mirror, if the position sensor is part of an interferometer system.

In an embodiment, the deformation signal as obtained is applied to determine or estimate a deformation or shape of the substrate table. When such a shape is determined, this could explain an occurring inconsistency in the redundant set of position signals. As a practical implementation, there may be an encoder based measurement system including 4 position sensors providing in total 8 position signals. 6 Position signals represent 6 degrees of freedom and 2 position signals are redundant. The set of 6 position signals, together with the shape of the substrate table as derived from the deformation signal can be used to predict the redundant two signals. In case a difference is noticed between the predicted redundant signals and the actual redundant signals, this can be an indication that a re-calibration of the encoder based measurement system may be required.

As will be understood by the skilled person, the more redundant position signals are available or the more deformation sensors are used, the more accurate the shape of the substrate table may be predicted.

Figure 4:
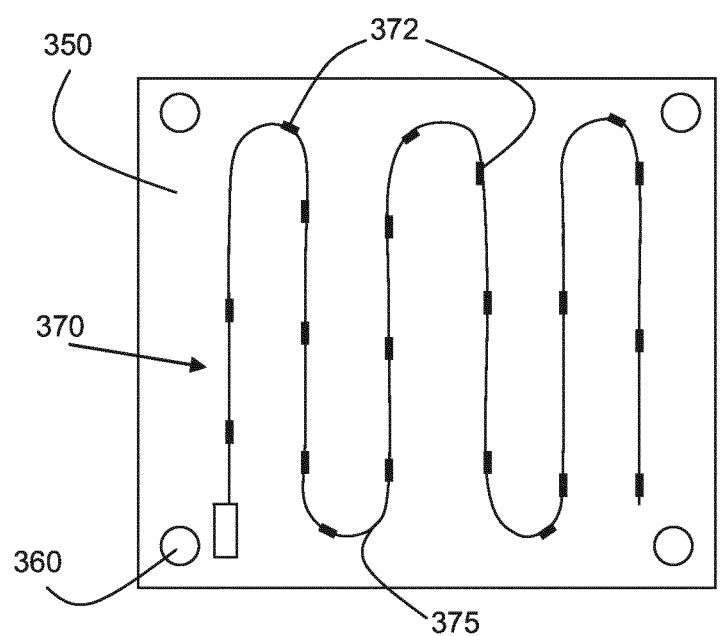
FIG. 4 depicts a top view of a substrate table including an FBG-array for determining a deformation of the substrate table.

In FIG. 4, a top view of a substrate table 350 is shown comprising 4 position sensors 360. The position sensors 360 may be encoder heads arranged to co-operate with a one or two-dimensional grating. FIG. 4 further schematically shows an FBG-array 370 comprising a plurality of FBGs 372 linked by a fiber 375.

In an embodiment, the FBG-array can be located near or at the top surface of the substrate table. By doing so, the deformation signal can provide accurate information on the shape of the support surface supporting the substrate, which enables a more accurate prediction of the shape or position of the substrate.

Figure 5:
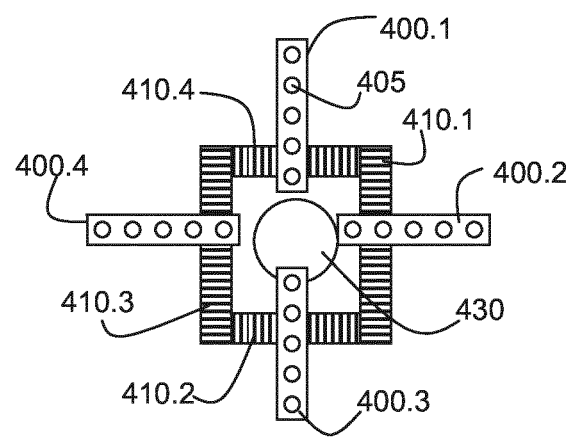
FIG. 5, comprising FIGS. 5(*a*) and 5(*b*), depicts two possible arrangements of encoder based position measurement systems for use in a positioning system according to an embodiment of the invention.
Figure 5:
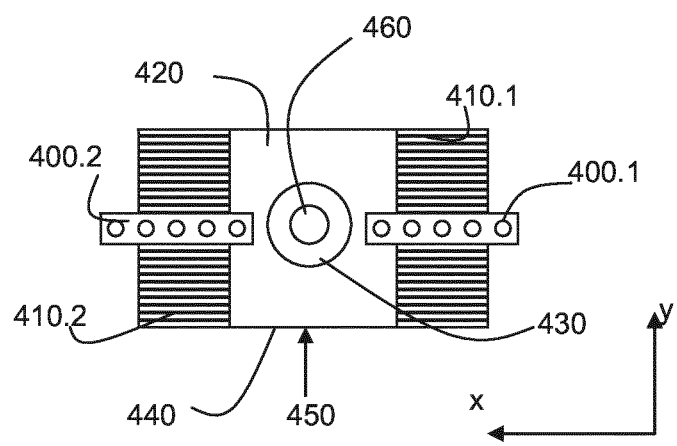

In FIG. 5, two other encoder based position measurement devices are schematically shown, said devices being suited to be applied in a positioning system according to an embodiment of the invention.

In FIG. 5 (a), a top view of an encoder based measurement system is schematically shown. The system comprises 4 sensor arrays 400.1, 400.2, 400.3 and 400.4, each comprising a plurality of sensors 405. The sensor arrays 400.1-400.4 may be mounted to a reference frame such as the metrology frame MF of FIG. 1. As shown in FIG. 5, the gratings 410.1-410.4 may be mounted to a substrate table 420 arranged to hold a substrate 430. By using 4 sensor arrays in the arrangement as shown, the stage can cover a comparatively large operating area under control of the sensors while maintaining the gratings comparatively small. When any of the sensors of the arrays is above any of the gratings, a position signal can be obtained and used in a similar manner as described above.

In FIG. 5 (b), an alternative arrangement is shown whereby only two gratings 410.1 and 410.2 are applied on opposite sides of the substrate table 420. Two sensor arrays 400.1 and 400.2 are arranged for co-operation with the gratings. In such arrangement, the gratings may be two-dimensional gratings, whereby the sensors are arranged to provide a three-dimensional position signal (x, y, z) to the processing unit. The arrangement as shown is particularly suited for use in an immersion type of lithographic apparatus whereby a displacement of the substrate table from underneath the projection system can take place without immersion fluid having to pass over the gratings. In FIG. 5b, the area indicated by 460 represents the area underneath the projection system that is covered with immersion fluid during use. As can be seen, a displacement of the substrate table in the y-direction enables the substrate table 420 to be moved away from the immersion liquid without the immersion liquid touching the gratings. Note that, in order to maintain positional information on the substrate table when moving away from the projection system, additional or larger sensor arrays may be applied. Additional sensor arrays may be positioned at different y-positions when the substrate table is moved in the positive Y-direction. As an alternative to applying additional sensor arrays, the substrate table 420 can be provided with a reflective surface 440 acting as a target surface for an interferometer beam (schematically indicated by the arrow 450) of an interferometer based position measurement device.

Figure 6:
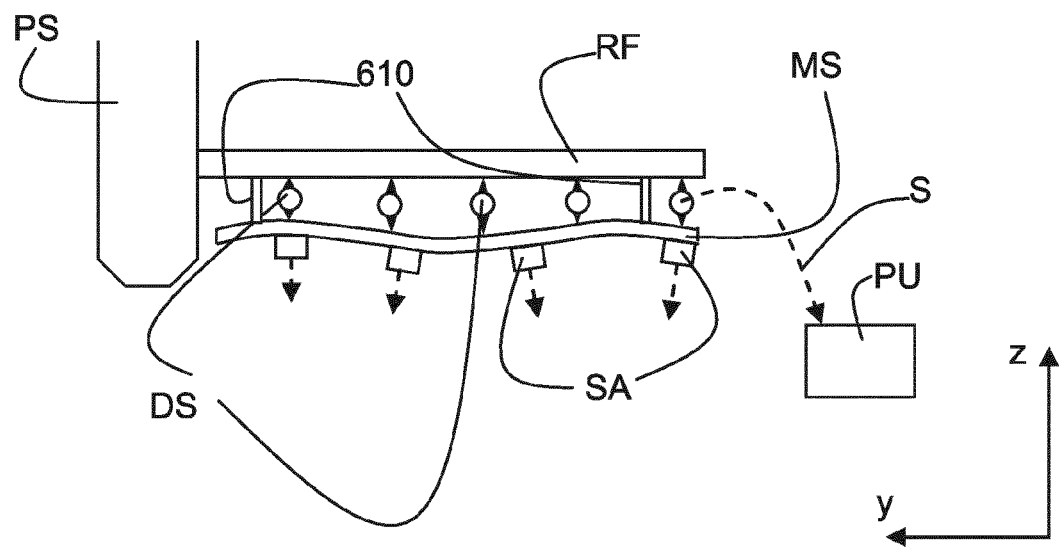
FIG. 6 depicts the use of further deformation sensors for providing deformation information about a sensor array of a position measurement device.

In an embodiment of the present invention, further deformation sensors are applied to the position measurement system for providing a further deformation signal. The further deformation sensors may be applied to a grating, for example one or more of the gratings 100.1-100.3 of FIG. 2 or the grating 300 of FIG. 3b. The further deformation sensors may be applied to a sensor array, such as the sensor arrays 400.1-400.4 of FIG. 5. In FIG. 6, an example of such a further set of deformation sensors mounted to a sensor array is schematically shown. In FIG. 6, a sensor array is schematically shown. The sensor array is mounted to a substantially stationary frame RF with a mounting device 610 that may have leaf springs. In the embodiment, the sensors SA of the sensor array are mounted to common mounting structure MS that is connected to the frame RF via the leaf springs 610. The array of sensors SA is arranged to co-operate with a grating mounted to an object table (not shown) for generating a position signal. The embodiment further comprises an array of deformation sensors DS, which may be the same sensors as sensors 250. The deformation sensors DS are arranged along the mounting structure MS to measure a position (e.g. a z-position) of the structure MS relative to the frame RF. The output signals S of the deformation sensors DS are provided to the processing unit PU. The output signals S can be used to provide a more detailed insight in the shape of the position measurement device. Such information can be used during calibrate of the position measurement system. As schematically shown in FIG. 6, a deformation of the mounting structure MS may result in one or more sensors SA no longer pointing along the Z-direction, which would be the normal measurement direction if the MS was not deformed, or the deformation may lead to a change in the Z-position of the sensor SA. Using the signals, the shape of the mounting structure MS can be derived or estimated. With the information about the shape, a position signal as obtained from the sensors SA can be corrected.

In an embodiment of the present invention, the processing unit further comprises a position controller configured to control a position of the positioning device. In such arrangement, the position controller may derive a set point for positioning device, based on a position signal of the position measurement device.

In an embodiment, the position controller may also take the deformation signal into account for determining the set point. By doing so, an improved positioning of the substrate can be obtained, in particular for the relevant portion of the substrate such as the portion of the substrate being exposed.

Figure 7:
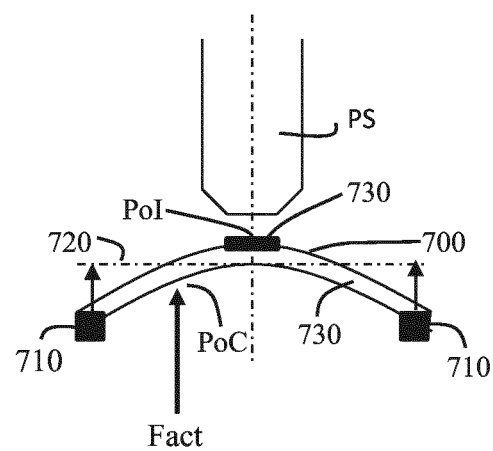
FIG. 7 depicts the impact of a non-rigid body behavior of the substrate table on the positioning of a point-of-interest.

This can be understood as follows: in general, the positioning device PW comprises a plurality of actuators or motors for positioning the substrate table by exerting a force Fact on predetermined locations of the substrate table. Such positions being referred to as points-of-control PoC. During an operation, the substrate table is displaced relative to the projection system PS to expose each die of the substrate. The location of the die being exposed is referred to as the point-of-interest PoI. In order to minimize overlay and focus errors, the positioning of the point-of-interest PoI is essential. It can further be noted that actual position of the point-of-interest PoI is difficult to measure, because the point-of-interest PoI is located directly underneath the projection system. In case the substrate table is behaving as a rigid body, a control of the position of the point-of-interest PoI can be obtained by controlling the position of the substrate table by exerting force Fact in the point-of-control PoC, based on the position signals. In case the substrate table is not behaving as a rigid body, this may result in an erroneous control of the positioning device. This is e.g. illustrated in FIG. 7. In FIG. 7, a deformed substrate table 700 is schematically shown. The substrate table 700 comprises two position sensors 710 for providing a position signal representing a vertical position of the substrate table 700. FIG. 7 further shows a projection system PS together with a plane 720 being the best focal plane of the projection system PS. FIG. 7 further shows a substrate 730 mounted to the substrate table 700. The part being exposed by the projection system is the point-of-interest in this example, and is indicated by PoI. As can be seen, the point-of-interest PoI is, in the situation as depicted, positioned above the best focal plane 720 and should thus be lowered in order to obtain an optimal exposure. Due to the deformation of the substrate table 700 however, the position signals indicate that the substrate table is below the best focal plane. As such, in case a position controller would determine the position set point of the positioning device solely on the position signals, the substrate table would be controlled to a position that would bring the point-of-interest PoI even more out of focus.

Using the positioning system according to an embodiment of the invention, the position measurement system may be used primarily to determine a position of the substrate table, or, in more general term, the object table, whereas the deformation sensors are used to determine a shape of the substrate table.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track. A track is a tool that typically applies a layer of resist to a substrate and develops the exposed resist). The substrate may be processed in a metrology tool and/or an inspection tool.

Although specific reference may have been made above to the use of embodiments of the invention in the context of optical lithography, it will be appreciated that the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The descriptions above are intended to be illustrative, not limiting. Thus, it will be apparent to one skilled in the art that modifications may be made to the invention as described without departing from the scope of the claims set out below.

What is claimed is:

1. A positioning system for positioning an object in a lithographic apparatus, the positioning system comprising:
   a support constructed to hold the object;
   a position measurement device configured to measure a position of the support, the position measurement device comprising at least one position sensor target and a plurality of position sensors to cooperate with the at least one position sensor target to provide a redundant set of position signals representing the position of the support;
   a deformation sensor arranged to provide a deformation signal representing a deformation of one of the support and the position measurement device, and
   a processor configured to calibrate one of the position measurement device and the deformation sensor based on the deformation signal and the redundant set of position signals.

2. The positioning system of claim 1, wherein the deformation sensor is connected to the one of the support and the position measurement device.

3. The positioning system of claim 2 wherein the deformation sensor Comprises a strain sensor.

4. The positioning system of claim 1, comprising a positioning device for positioning the support, wherein the processor further comprises a position controller for controlling a position of the positioning device, the position controller being arranged to determine a set point for the positioning device based on the redundant set of position signals and the deformation signal.

5. A lithographic apparatus comprising the positioning system of claim 1, the lithographic apparatus comprising a patterning device support constructed to support a patterning device having a pattern, a substrate table constructed to hold a substrate, and a projection system constructed to project the pattern onto the substrate,
   wherein the support comprises the patterning device support, wherein the object comprises the patterning device.

6. A lithographic apparatus comprising the positioning system of claim 1, the lithographic apparatus comprising a patterning device support constructed to support a patterning device having a pattern, a substrate table constructed to hold a substrate, and a projection system constructed to project the pattern onto the substrate,
   wherein the support comprises the substrate table, and wherein the object comprises the substrate.

7. The lithographic apparatus of claim 6, comprising a stationary frame, wherein the at least one position sensor target comprises a grating connected to the stationary frame and wherein the plurality of position sensors are connected to the substrate table.

8. The lithographic apparatus of claim 6, comprising a stationary frame, wherein the at least one position sensor target comprises a grating connected to the substrate table and wherein the plurality of position sensors are connected to the stationary frame.

9. The lithographic apparatus of claim 7, wherein the stationary frame supports the projection system.

10. The lithographic apparatus of claim 5, wherein the position measurement device comprises an interferometer.

11. A device manufacturing method comprising
    positioning an object using a positioning system of claim 1.

12. The positioning system of claim 1, wherein the processor is configured to determine a shape of the support based on the deformation signal,
    wherein the processor is configured to determine an inconsistency in the redundant set of position signals based on the shape of the support and based on the redundant set of position signals.

13. The positioning system of claim 2, wherein the processor is configured to re-calibrate the position measurement device based on the inconsistency in the redundant set of position signals.

14. A device manufacturing method comprising positioning an object using a lithographic apparatus of claim 5.

* * * * *